(12) United States Patent
Chou et al.

(10) Patent No.: US 12,007,430 B2
(45) Date of Patent: Jun. 11, 2024

(54) DEVICE FOR TESTING A GROUP OF RADIO-FREQUENCY (RF) CHIP MODULES AND METHOD FOR USING THE SAME

(71) Applicant: OHMPLUS TECHNOLOGY INC., New Taipei (TW)

(72) Inventors: Hsi-Tseng Chou, New Taipei (TW); Chih-Wei Chiu, New Taipei (TW); Zhao-He Lin, New Taipei (TW); Jake Waldvogel Liu, New Taipei (TW)

(73) Assignee: Ohmplus Technology Inc., New Taipei (TW)

( * ) Notice: Subject to any disclaimer, the term of this patent is extended or adjusted under 35 U.S.C. 154(b) by 29 days.

(21) Appl. No.: 18/055,700

(22) Filed: Nov. 15, 2022

(65) Prior Publication Data

US 2023/0160948 A1 May 25, 2023

Related U.S. Application Data

(60) Provisional application No. 63/281,274, filed on Nov. 19, 2021.

(51) Int. Cl.
*G01R 31/28* (2006.01)

(52) U.S. Cl.
CPC ..... *G01R 31/2822* (2013.01); *G01R 31/2841* (2013.01)

(58) Field of Classification Search
CPC ............ G01R 31/2822; G01R 31/2856; G01R 31/311; G01R 31/2818; G01R 31/2853; G01R 31/54; G01R 19/00; G01R 23/02; G01R 31/28; G01R 31/2836; G01R 33/422; G01R 31/2896; G01R 31/2851; G01R 31/2841; H04B 1/40; H04B 17/29; H04B 17/0085; H04B 17/15; H04B 17/19; H04B 17/14; H04B 17/309; H04B 17/21; H04B 17/11; H04B 17/17; Y02D 30/70

See application file for complete search history.

(56) References Cited

U.S. PATENT DOCUMENTS

| | | | |
|---|---|---|---|
| 10,069,578 B2 * | 9/2018 | Tsai | H04B 17/29 |
| 10,320,494 B2 * | 6/2019 | Chung | G01R 31/2822 |
| 11,336,311 B2 * | 5/2022 | Lee | H04B 1/0483 |
| 2023/0160948 A1 * | 5/2023 | Chou | G01R 31/2822 |
| | | | 324/615 |
| 2023/0160955 A1 * | 5/2023 | Chou | G01R 31/3183 |
| | | | 324/762.01 |

\* cited by examiner

*Primary Examiner* — Vinh P Nguyen
(74) *Attorney, Agent, or Firm* — Rosenberg, Klein & Lee

(57) ABSTRACT

A device for testing a group of radio-frequency (RF) chip modules and a method for using the same is disclosed. The device includes a signal analyzer, a power divider, control ICs, a signal controller, and a power combiner. The power divider receives an RF signal and transmits RF input signals to the RF chip modules and the control ICs in response to the RF signal. The signal controller controls each control IC to adjust at least one of the power and the phase of the corresponding RF input signal, thereby generating an RF output signal. The power combiner receives the RF output signal from each control IC to generate a test signal. The signal analyzer receives the test signal and obtains RF properties corresponding to at least one of the power and the phase of each RF output signal.

14 Claims, 5 Drawing Sheets

DEVICE FOR TESTING A GROUP OF RADIO-FREQUENCY (RF) CHIP MODULES AND METHOD FOR USING THE SAME

This application claims priority of U.S. Provisional Application No. 63/281,274 filed on 19 Nov. 2021 under 35 U.S.C. § 119(e); the entire contents of all of which are hereby incorporated by reference.

BACKGROUND OF THE INVENTION

Field of the Invention

The present invention relates to testing technology, particularly to a device for testing a group of radio-frequency (RF) chip modules and a method for using the same.

Description of the Related Art

With the development and various applications of mobile communication, a variety of radio-frequency (RF) chip modules are currently developed. In the development of the RF chip modules, a package test socket and a RF measurement instrument are needed to measure the electrically conductive parameters of the RF chip modules. During the measurement, a plurality of RF chip modules is arranged on the package test base one by one, and the probes directly contact the pins of the RF chip module to form an electrical connection with the RF chip module. Then, the RF instrument transmits and measures the test signals to perform the electrically conductive test of the RF chip module.

FIG. 1 is a diagram schematically illustrating a conventional device for testing a single RF chip module. Referring to FIG. 1, an RF chip module 10 is installed on a test board 12. The RF instrument of a signal transceiver 14 feeds the signal into the input of the RF chip module 10. The output of the RF chip module 10 is connected to the RF instrument through an RF connection cable. The test board 12 has a power-supplying circuit and a signal-controlling circuit for controlling the operation of the RF chip module 10. As a result, the test board 12 is externally connected to a control unit 16 and a power supply. The control unit 16 and the power supply respectively provide a control signal and a power signal. The signal transceiver 14 and the control unit 16 are controlled by a control host 18. The control unit 16 can be programmed according to the functions of the RF chip module 10. In conventional technologies, the foregoing architecture sequentially provides control signals to detect the characteristics of the RF chip modules 10. The functions of the RF chip module 10 are tested by comparing data read by a network analyzer and the theoretical characteristics of a standard RF chip module 10. If the data meet the defined characteristic outputs, the RF chip module 10 is determined to be normal. If the data do not meet the defined characteristic outputs, the RF chip module 10 is determined to be disabled or defective. In terms of calibration, the output of the RF chip module 10 can meet the specifications by defining or adjusting parameters. Alternatively, a user integrates the RF chip module 10 into the corresponding circuit by defining an output table. Otherwise, the user operates the RF chip module 10 according to the defined table. As a result, when the test is qualified, the output characteristics of the RF chip module 10 need to be adjusted to meet the designed specifications. In this calibration, it is necessary to adjust the control signal to make the corresponding relationship between the output and the input of the RF chip module 10 meet the usage standard. In the architecture of the single RF chip module 10, the calibration method adjusts the control signal step by step until the output and input signals of the RF chip module 10 achieve the desired effect.

FIG. 2 is a diagram schematically illustrating a conventional device for testing a group of RF chip modules. Refer to FIG. 2; using the group testing method, the action time of the mechanical movement mechanism for placing the chip is reduced because it does not need to place the chip and test it one by one. In addition, the time for loading, unloading, connecting signal cables, etc., required for testing RF chip modules with the RF instrument one by one can be reduced to achieve the fast purpose. In the method, a test board 20 is installed with a plurality of RF chip modules 22. The test board 20 is also installed with switches 24 and 26. The switches 24 and 26 can select an RF chip module 22 at a different time to construct a complete RF signal loop for testing. Accordingly, the test board 20 has a power-supplying circuit, a signal-controlling circuit, an external power supply, and a control unit 28 to perform the test work. In the conventional switching method, the switches 24 and 26 sequentially switch the RF chip modules 22 in different paths to construct a complete RF signal loop for testing. The method for testing the complete RF signal loop is identical to the method for testing the RF chip module of FIG. 1. The test board 20 is provided with RF sockets. The RF sockets are installed with the RF chip modules 22. The bottom of the socket has pins that can be connected to the RF chip module 22 to control the working state of the RF chip module 22. The RF signal of the RF chip module 22 is guided to the vector network/spectrum analyzer 30 through the pins to analyze the RF characteristics of the RF chip modules 22 one by one. This path passes through the switch 26 and a directional coupler 32, and finally enters a vector spectrum analyzer 30. The switches 24 and 26 mainly switch a path to the RF chip module 22 under test. When testing the first RF chip module 22, the switches 24 and 26 will switch the path to test the first RF chip module 22, and the other paths will be disconnected to form a single RF signal loop. When the signal passes through the directional coupler 32, the main signal will return to a modem 34 to guarantee the normal operation of the RF chip module 22, and the other signal will be coupled to the signal analyzer 30 to analyze the test results. After testing the first RF chip module 22, the switches 24 and 26 will switch the path to test the second RF chip module 22 to form a second RF signal loop. In this order, the RF chip modules 22 are tested one by one. The architecture has the characteristic that the test board 20 has a system-planned design. The external control unit 28 not only controls the operation mode of the RF chip module 22, but also turns on or off the switches 24 and 26. The architecture is very simple, and its fabrication cost is low. However, the test time is very long. Using switches 24 and 26 for each path causes RF matching problems and excessive power loss because switches 24 and 26 involve multiple stages of construction.

To overcome the abovementioned problems, the present invention provides a device for testing a group of radio-frequency (RF) chip modules and a method for using the same, so as to solve the afore-mentioned problems of the prior art.

SUMMARY OF THE INVENTION

The present invention provides a device for testing a group of radio-frequency (RF) chip modules and a method for using the same, which shorten the test time, avoid the deviations of the RF characteristics due to the open circuit of RF circuits, and maintain the accuracy of the measurement.

In an embodiment of the present invention, a device for testing a group of radio-frequency (RF) chip modules includes a signal analyzer, a power divider, a signal-controlling circuit, and a power combiner. The signal analyzer is configured to generate a radio-frequency (RF) signal. The power divider is electrically connected to the signal analyzer and a plurality of radio-frequency (RF) chip modules. The power divider is configured to receive the RF signal, generate radio-frequency (RF) input signals in response to the RF signal, and respectively transmit the RF input signals to the plurality of RF chip modules. The total power of the RF input signals is equal to the power of the RF signal. The signal-controlling circuit is electrically connected to the plurality of RF chip modules. The signal-controlling circuit is configured to receive the RF input signals through the plurality of RF chip modules and adjust at least one of the power and the phase of each of the RF input signals to generate radio-frequency (RF) output signals. The power combiner is electrically connected to the signal-controlling circuit and the signal analyzer. The power combiner is configured to receive the RF output signals and sum power of the RF output signals to generate a test signal. The signal analyzer is configured to receive the test signal and obtain radio-frequency (RF) properties corresponding to at least one of the power and the phase of each of the RF output signals.

In an embodiment of the present invention, the signal-controlling circuit includes a plurality of control ICs and a signal controller. The plurality of control ICs is respectively electrically connected to the plurality of RF chip modules and the power combiner. The plurality of control ICs are respectively configured to receive the RF input signals through the plurality of RF chip modules. The signal controller is electrically connected to the plurality of control ICs. The signal controller is configured to control the plurality of control ICs to adjust at least one of the power and the phase of each of the RF input signals and drive the plurality of control ICs to respectively generate the RF output signals.

In an embodiment of the present invention, each of the plurality of control ICs includes a phase shifter, a variable attenuator, and an amplifier. The phase shifter is electrically connected to the signal controller and a corresponding radio-frequency (RF) chip module of the plurality of RF chip modules. The phase shifter is configured to receive the RF input signal through the corresponding RF chip module. The signal controller is configured to control the phase shifter to adjust the phase of the RF input signal. The variable attenuator is electrically connected to the signal controller and the phase shifter. The variable attenuator is configured to receive the RF input signal from the phase shifter. The signal controller is configured to control the variable attenuator to adjust the power of the RF input signal. The amplifier is electrically connected to the variable attenuator and the power combiner. The amplifier is configured to receive the RF input signal from the variable attenuator and amplify the power of the RF input signal to generate the RF output signal. The combined uses of the variable attenuator and amplifier may control the power ratio of each RF path associated with the RF chips under test, and produce sufficient signal strengths to assure a good signal-to-noise ratio for an accurate measurement.

In an embodiment of the present invention, the device for testing a group of RF chip modules further includes a control host electrically connected to the signal controller and the signal analyzer and configured to control the operation of the signal controller and the signal analyzer.

In an embodiment of the present invention, the device for testing a group of RF chip modules further includes a test base provided with RF sockets. The RF sockets are respectively electrically connected to the plurality of RF chip modules. The power combiner, the signal-controlling circuit, and the power provider are arranged on the test base and electrically connected to the test base.

In an embodiment of the present invention, the signal analyzer is a vector network analyzer or a vector spectrum analyzer.

In an embodiment of the present invention, a device for testing a group of radio-frequency (RF) chip modules a signal analyzer, a power divider, a plurality of control ICs, a signal controller, and a power combiner. The signal analyzer is configured to generate a radio-frequency (RF) signal. The power divider is electrically connected to the signal analyzer and a plurality of radio-frequency (RF) chip modules. The power divider is configured to receive the RF signal, generate radio-frequency (RF) input signals in response to the RF signal, and respectively transmit the RF input signals to the plurality of RF chip modules. The total power of the RF input signals is equal to the power of the RF signal. The plurality of control ICs are respectively integrated in the plurality of RF chip modules. The plurality of control ICs is respectively configured to receive the RF input signals through the plurality of RF chip modules. The signal controller is electrically connected to the plurality of control ICs. The signal controller is configured to control each of the plurality of control ICs to adjust at least one of the power and the phase of the corresponding RF input signal to generate a radio-frequency (RF) output signal. The power combiner is electrically connected to each of the plurality of control ICs and the signal analyzer. The power combiner is configured to receive the RF output signal from each of the plurality of control ICs and sum power of the RF output signals of the plurality of control ICs to generate a test signal. The signal analyzer is configured to receive the test signal and obtain radio-frequency (RF) properties corresponding to at least one of the power and the phase of each of the RF output signals of the plurality of control ICs.

In an embodiment of the present invention, each of the plurality of control ICs a phase shifter, a variable attenuator, and an amplifier. The phase shifter is electrically connected to the signal controller and a corresponding radio-frequency (RF) chip module of the plurality of RF chip modules. The phase shifter is configured to receive the RF input signal through the corresponding RF chip module. The signal controller is configured to control the phase shifter to adjust the phase of the RF input signal. The variable attenuator is electrically connected to the signal controller and the phase shifter. The variable attenuator is configured to receive the RF input signal from the phase shifter. The signal controller is configured to control the variable attenuator to adjust the power of the RF input signal. The amplifier is electrically connected to the variable attenuator and the power combiner. The amplifier is configured to receive the RF input signal from the variable attenuator and amplify the power of the RF input signal to generate the RF output signal.

In an embodiment of the present invention, the device for testing a group of RF chip modules further includes a control host electrically connected to the signal controller and the signal analyzer and configured to control the operation of the signal controller and the signal analyzer.

In an embodiment of the present invention, the device for testing a group of RF chip modules further includes a test base provided with RF sockets. The RF sockets are respectively electrically connected to the plurality of RF chip modules. The power combiner and the power provider are arranged on the test base and electrically connected to the test base.

In an embodiment of the present invention, the signal analyzer is a vector network analyzer or a vector spectrum analyzer.

In an embodiment of the present invention, a method for testing a group of radio-frequency (RF) chip modules includes: receiving a radio-frequency (RF) signal, generating radio-frequency (RF) input signals in response to the RF signal, and respectively transmitting the RF input signals to a plurality of RF chip modules, wherein total power of the RF input signals is equal to power of the RF signal; receiving the RF input signals through the plurality of RF chip modules and adjusting at least one of power and a phase of each of the RF input signals to generate radio-frequency (RF) output signals; summing power of the RF output signals to generate a test signal; and receiving the test signal and obtaining radio-frequency (RF) properties corresponding to at least one of power and a phase of each of the RF output signals.

In an embodiment of the present invention, in the step of adjusting at least one of the power and the phase of each of the RF input signals, the phase and the power of each of the RF input signals are sequentially adjusted.

To sum up, the device for testing a group of RF chip modules and the method for using the same employ the control IC to adjust the phase or the power of the RF signal and determine the object under test according to the phase or the power of the RF output signal, so as to shorten the test time.

Below, the embodiments are described in detail in cooperation with the drawings to make easily understand the technical contents, characteristics, and accomplishments of the present invention.

DETAILED DESCRIPTION OF THE INVENTION

Figure 1:
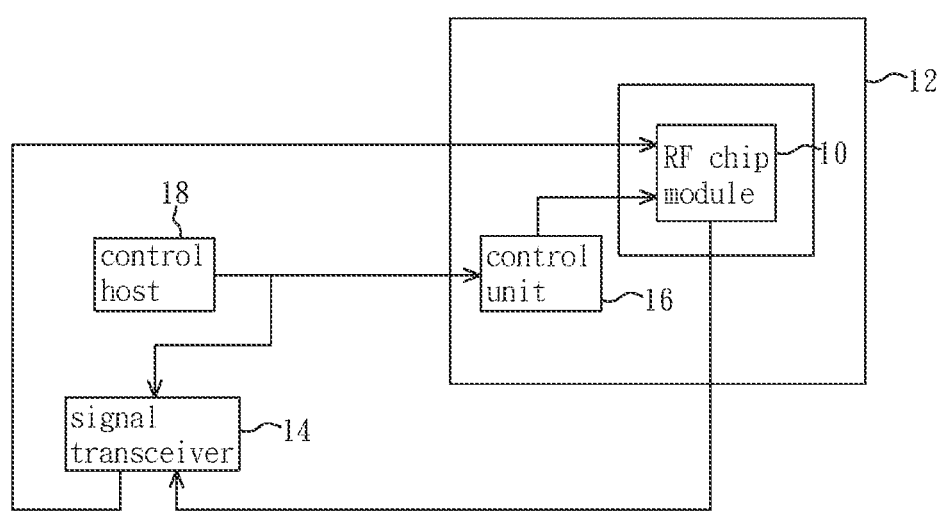
FIG. 1 is a diagram schematically illustrating a conventional device for testing a single RF chip module.
Figure 2:
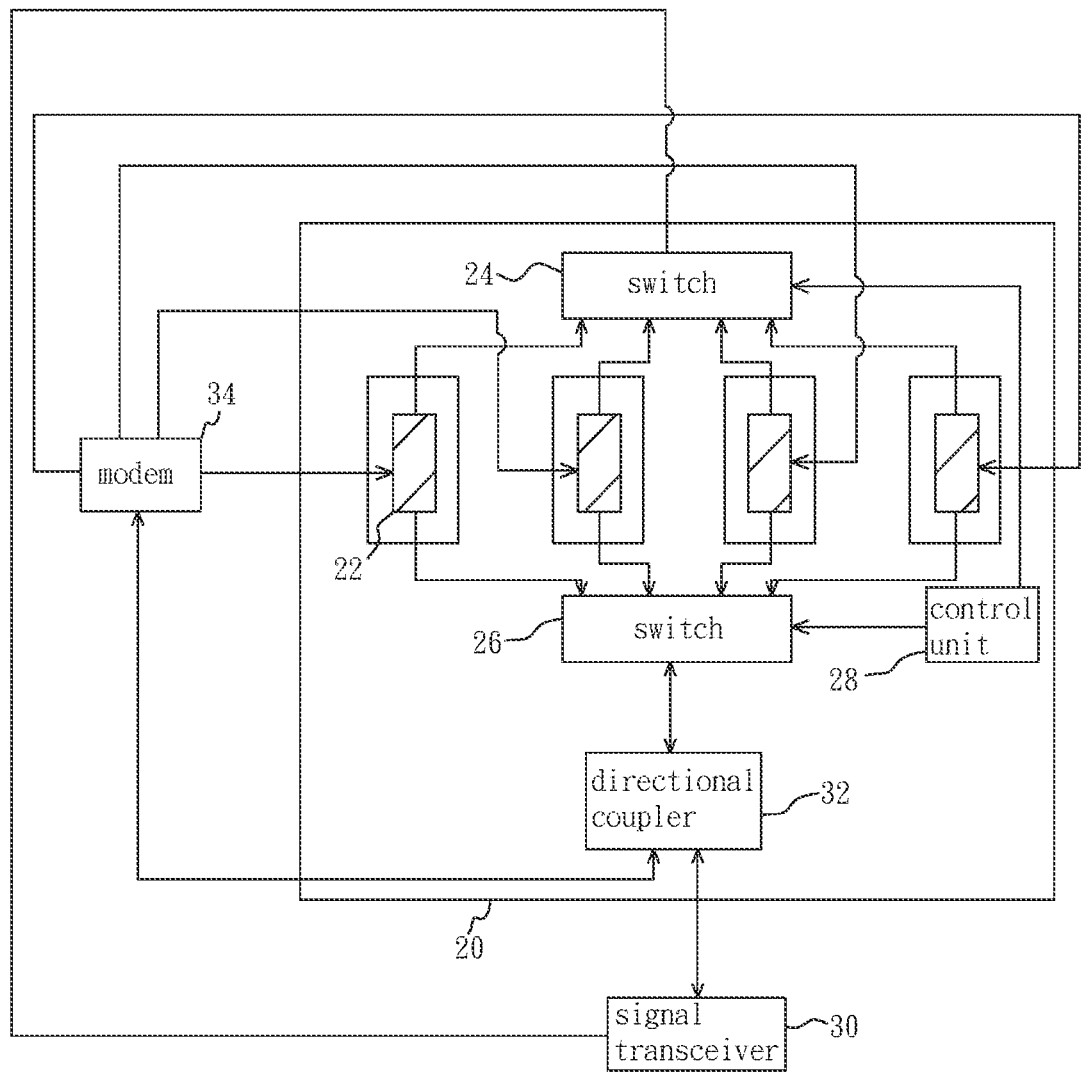
FIG. 2 is a diagram schematically illustrating a conventional device for testing a group of RF chip modules.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

A device for testing a group of radio-frequency (RF) chip modules and a method for using the same will be provided as follows. The device for testing a group of RF chip modules and the method for using the same employ a control IC to adjust the phase or the power of a RF signal and determine an object under test according to the phase or the power of the RF output signal, so as to shorten the test time.

Figure 3:
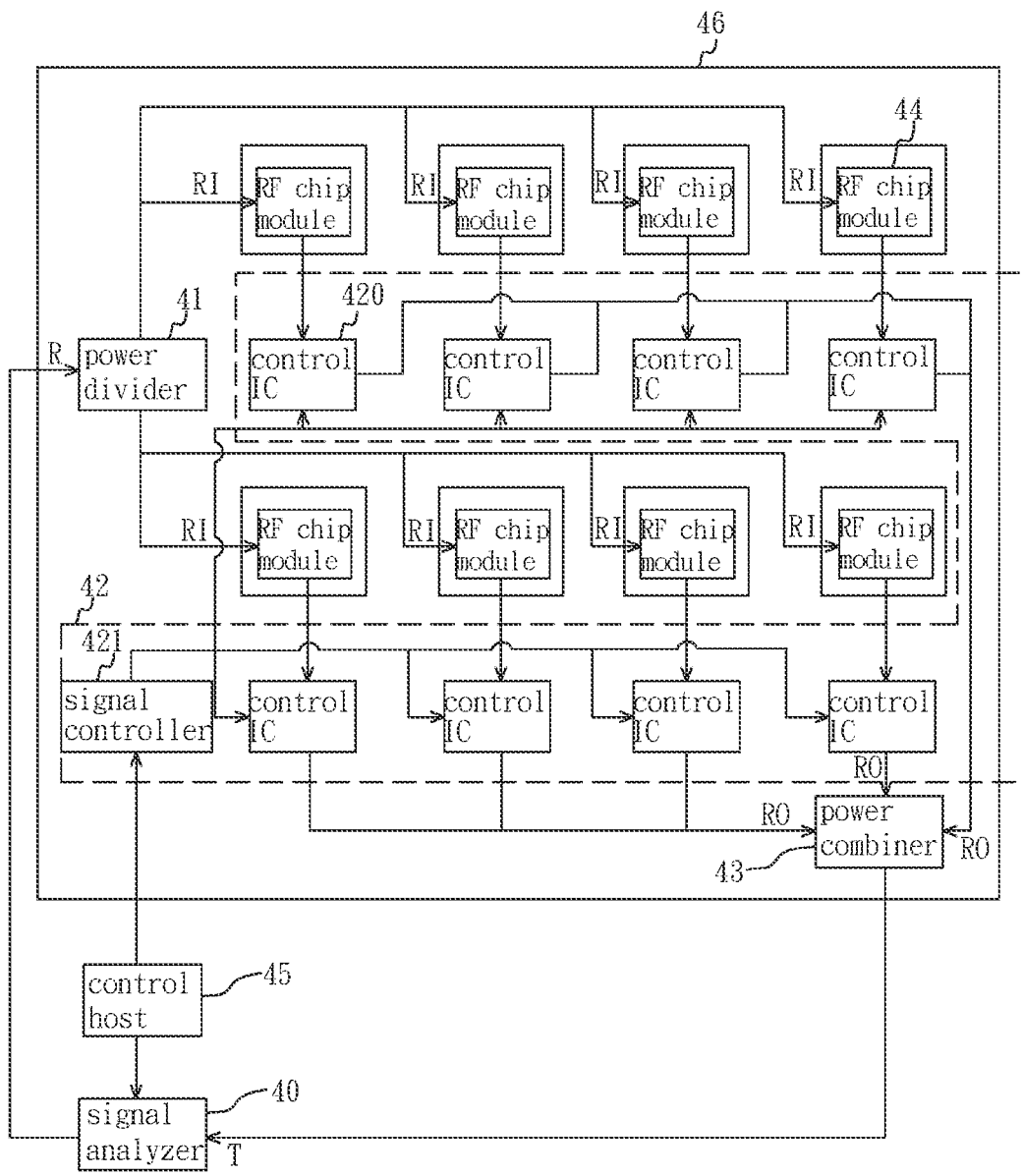
FIG. 3 is a diagram schematically illustrating a device for testing a group of radio-frequency (RF) chip modules according to a first embodiment of the present invention.
Figure 4:
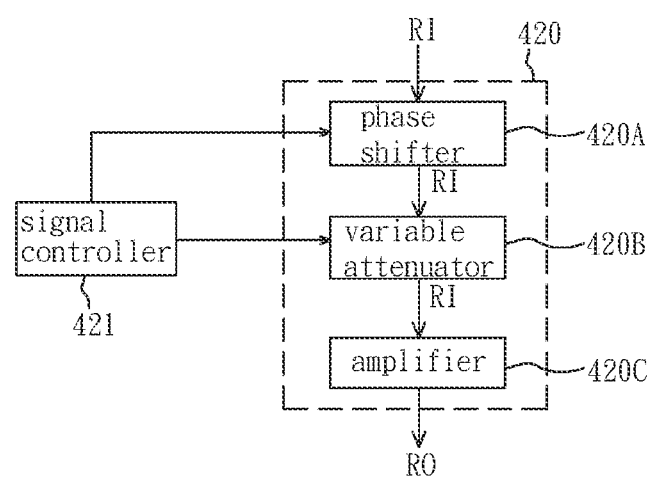
FIG. 4 is a diagram schematically illustrating a control IC according to an embodiment of the present invention.

FIG. 3 is a diagram schematically illustrating a device for testing a group of radio-frequency (RF) chip modules according to a first embodiment of the present invention. FIG. 4 is a diagram schematically illustrating a control IC according to an embodiment of the present invention. Referring to FIG. 3 and FIG. 4, a first embodiment of a device 4 for testing a group of RF chip modules is introduced as follows. The device 4 for testing a group of RF chip modules includes a signal analyzer 40, a power provider 41, a signal-controlling circuit 42, and a power combiner 43. The signal analyzer 40 may be, but not limited to, a vector spectrum analyzer. The power provider 41 is electrically connected to the signal analyzer 40 and a plurality of RF chip modules 44. The signal-controlling circuit 42 is electrically connected to the RF chip modules 44. The power combiner 43 is electrically connected to the signal-controlling circuit 42 and the signal analyzer 40.

The method for testing a group of RF chip modules is introduced as follows. Firstly, the signal analyzer 40 generates a RF signal R. The power provider 41 receives the RF signal R, generates radio-frequency (RF) input signals RI in response to the RF signal R, and respectively transmits the RF input signals RI to the RF chip modules 44. The total power of the RF input signals RI is equal to the power of the RF signal R. The signal-controlling circuit 42 receives the RF input signals RI through the RF chip modules 44 and adjusts at least one of the power and the phase of each of the RF input signals RI to generate radio-frequency (RF) output signals RO. The power combiner 43 receives the RF output signals RO and sums the power of the RF output signals RO to generate a test signal T. The signal analyzer 40 receives the test signal T and obtains radio-frequency (RF) properties corresponding to at least one of the power and the phase of each of the RF output signals RO. The power and the phase of each RF output signal RO represent the mark of the corresponding RF chip module 44. The signal analyzer 40 can simultaneously test all the RF chip modules 44 and determine the object under test according to the power or the phase of the RF output signal RO to shorten the test time. When the number of the RF chip modules 44 is four, the test time is 8 seconds.

The signal-controlling circuit 42 may include a plurality of control ICs 420 and a signal controller 421. The control ICs 420 are respectively electrically connected to the RF chip modules 44 and the power combiner 43. The signal controller 421 is electrically connected to the control ICs 420. The control ICs 420 respectively receive the RF input signals RI through the RF chip modules 44. The signal controller 421 controls the control ICs 420 to adjust at least one of the power and the phase of each of the RF input signals RI and drives the control ICs 420 to respectively generate the RF output signals RO.

Each of the control ICs 420 may include a phase shifter 420A, a variable attenuator 420B, and an amplifier 420C. The phase shifter 420A is electrically connected to the signal controller 421 and the corresponding radio-frequency (RF) chip module 44 of the RF chip modules 44. The variable attenuator 420B is electrically connected to the signal controller 421 and the phase shifter 420A. The amplifier 420C is electrically connected to the variable attenuator 420B and the power combiner 43. The positions of the phase shifter 420A, the variable attenuator 420B, and the amplifier 420C are adaptable according to requirements. The phase shifter 420A receives the RF input signal RI through the corresponding RF chip module 44. The signal controller 421 controls the phase shifter 420A to adjust the phase of the RF input signal RI. The variable attenuator 420B receives the RF input signal RI from the phase shifter 420A. The signal controller 421 controls the variable attenuator 420B to adjust the power of the RF input signal RI. The amplifier 420C receives the RF input signal RI from the variable attenuator 420B and amplifies the power of the RF input signal RI to generate the RF output signal RO.

In some embodiments of the present invention, the device 4 for testing a group of RF chip modules may further include a control host 45 electrically connected to the signal controller 421 and the signal analyzer 40. The control host 45 controls the operation of the signal controller 421 and the signal analyzer 40. The control host 45 knows the power and the phase of each RF input signal RI and transmits them to the signal analyzer 40. The signal analyzer 40 recognizes the RF output signals RO corresponding to the RF chip modules 44. In addition, the device 4 for testing a group of RF chip modules may further include a test base 46 provided with RF sockets. The RF sockets are respectively electrically connected to the RF chip modules 44. The power combiner 41, the signal-controlling circuit 42, and the power provider 43 are arranged on the test base 46 and electrically connected to the test base 46.

Figure 5:
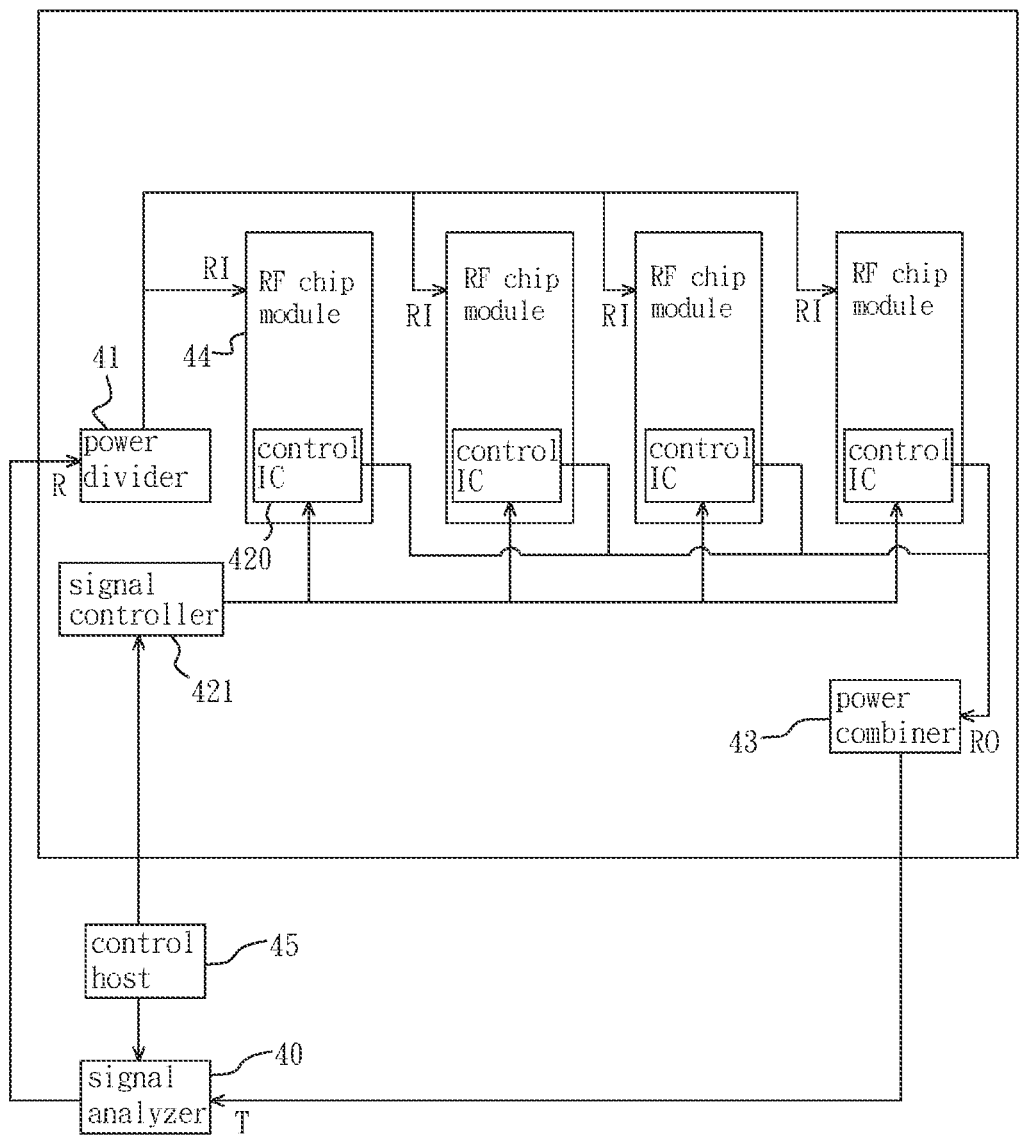
FIG. 5 is a diagram schematically illustrating a device for testing a group of radio-frequency (RF) chip modules according to a second embodiment of the present invention.

FIG. 5 is a diagram schematically illustrating a device for testing a group of radio-frequency (RF) chip modules according to a second embodiment of the present invention. Referring to FIG. 4 and FIG. 5, a second embodiment of the device 4 for testing a group of radio-frequency (RF) chip modules is introduced as follows. The device 4 for testing a group of RF chip modules includes a signal analyzer 40, a power provider 41, a plurality of control ICs 420, a signal controller 421, and a power combiner 43. The signal analyzer 40 may be, but is not limited to, a vector spectrum analyzer. The power provider 41 is electrically connected to the signal analyzer 40 and a plurality of RF chip modules 44. The control ICs 420 are respectively integrated into the RF chip modules 44. The signal controller 421 is electrically connected to the control ICs 420. The power combiner 43 is electrically connected to each control IC 420 and the signal analyzer 40.

The method for testing a group of RF chip modules is introduced as follows. Firstly, the signal analyzer 40 generates a radio-frequency (RF) signal R. The power divider 41 receives the RF signal R, generates radio-frequency (RF) input signals RI in response to the RF signal R, and respectively transmit the RF input signals RI to the RF chip modules 44. The total power of the RF input signals RI is equal to the power of the RF signal R. The control ICs 420 respectively receive the RF input signals RI through the RF chip modules 44. The signal controller 421 controls each of the control ICs 420 to adjust at least one of the power and the phase of the corresponding RF input signal RI to generate a radio-frequency (RF) output signal RO. The power combiner 43 receives the RF output signal RO from each of the control ICs 420 and sums the power of the RF output signals RO of the control ICs 420 to generate a test signal T. The signal analyzer 40 receives the test signal T and obtains radio-frequency (RF) properties corresponding to at least one of the power and the phase of each of the RF output signals RO of the control ICs 420. The power and the phase of each RF output signal RO represent the mark of the corresponding RF chip module 44. The signal analyzer 40 can simultaneously test all the RF chip modules 44 and determine the object under test according to the power or the phase of the RF output signal RO to shorten the test time. When the number of the RF chip modules 44 is four, the test time is 8 seconds.

The internal circuit of the control IC 420 of the second embodiment and its operation are identical to those of the first embodiment, so it will not be reiterated.

In some embodiments of the present invention, the device 4 for testing a group of RF chip modules may further include a control host 45 electrically connected to the signal controller 421 and the signal analyzer 40. The control host 45 controls the operation of the signal controller 421 and the signal analyzer 40. The control host 45 knows the power and the phase of each RF input signal RI and transmits them to the signal analyzer 40. The signal analyzer 40 recognizes the RF output signals RO corresponding to the RF chip modules 44. In addition, the device 4 for testing a group of RF chip modules may further include a test base 46 provided with RF sockets. The RF sockets are respectively electrically connected to the RF chip modules 44. The power combiner 41, the signal-controlling circuit 42, and the power provider 43 are arranged on the test base 46 and electrically connected to the test base 46.

The following paragraphs describe how the signal analyzer 40 determines an object under test. Assume that an external RF instrument generates an RF signal I(t). The power divider distributes the RF signal I(t) to provide N RF path signals. The RF signal of the nth RF path is represented with $I_n(t)$. Thus, $$I(t) = \sum_{n=1}^{N} I_n(t),$$

where t represents time and N represents the total number of the control ICs and the RF chips under test. In the nth path, the signal response generated by the control IC and the RF chip module under test is represented with $Q_n(t)=S_n(t)R_n(t)$. $S_n(t)$ represents the signal response generated by the nth control IC, and $R_n(t)$ represents the signal responses by the nth RF chip module under test. If there is no controller IC, $S_n(t)=1$, or only the transmission line generates signal variations. In the nth RF path, the signal generated by feeding $I_n(t)$ into the control IC and the RF chip module under test is represented with $I_n(t)Q_n(t)$. The power combiner sums the signals to generate a total signal $V_{tot}(t)$, as shown by formula (1).

$$V_{tot}(t) = \sum_{n=1}^{N} I_n(t)Q_n(t) \tag{1}$$

Formula (1) indicates that the RF signal is generated by the RF circuit and the power combiner and measured by the RF network and the spectrum analyzer when the RF signal is output after reacting with the RF chip module. The identification and calibration of the characteristics of the RF chip module require the information of $I_n(t)Q_n(t)$, especially $Q_n(t)$, because $I_n(t)$ is known. According to formula (1), $I_n(t)Q_n(t)$ can be solved. $I_n(t)R_n(t)$ can be found if $S_n(t)$ is controllable or a sequence of codes, etc. can be identified using digital signal processing. Therefore, formula (2) is obtained according to formula (1).

$$V_{tot}(t) = \sum_{n=1}^{N} S_n(t)[I_n(t)R_n(t)] \tag{2}$$

Formula (2) has N unknown functions. N signals are needed to solve the N $[I_n(t)R_n(t)]$. As a result, the technology focuses on generating $S_n(t)$ and using hardware to implement $S_n(t)$.

(1) Assume $S_n(t)=\delta(t-t_n)$, where $\delta(\ )$ represents a pulse function, and $t_n$ represents the nth time point.

$$V_{tot}(t_{n-1} < t < t_n) = I_n(t)R_n(t) \tag{3}$$

Formula (3) may be implemented by switching the RF chip modules or other components, as illustrated in FIG. 3. Alternatively, Formula (3) may be implemented by the RF switch. As a result, the recognition code of the nth path is 00 . . . 1000 . . . , etc.

(2) One assumes $$S_n(t) = e^{j\frac{2\pi nm}{N}}.$$

$I_n(t)$ passes $S_n(t)$ in formula (2) to obtain formula (4).

$$V_{tot}(t) = \sum e^{\frac{j2\pi nm}{N}}[I_n(t)R_n(t)] \tag{4}$$

According to formula (4), a constant phase variation is generated to obtain the relation of discrete Fourier transform (DFT).

(3) One assumes that $S_n(t)$ generates orthogonal signals. It can be solved by the inner product of the signal function, as shown by the formula (5).

$$[I_n(t)R_n(t)](S_n(t),S_n(t))=(V_{tot}(t),S_n(t)) \tag{5}$$

(4) If Sn(t)'s signals are not orthogonal, then formula (5) generates a set of linear equations. One may solve the linear equations to find $[I_n(t)R_n(t)]$.

(5) If the internal RF devices of the RF chip module can be accessed, the Rn(t)=1, but $S_n(t)=R'_n(t) S'_n(t)$ can be expressed associated with the control ICs inside the RF chip modules, where the $S'_n(t)$ represents the responses of the controllable ICs in the RF chip module, and $R'_n(t)$ represents the response from the other components inside the RF chips.

According to the embodiments provided above, the device for testing a group of RF chip modules and the method for using the same employ the control IC to adjust the phase or the power of the RF signal or generate the corresponding recognition code, and determine the object under test to shorten the test time according to the phase or the power of the RF output signal or the recognition code.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A device for testing a group of radio-frequency (RF) chip modules comprising:
   a signal analyzer configured to generate a radio-frequency (RF) signal;
   a power divider electrically connected to the signal analyzer and a plurality of radio-frequency (RF) chip modules, wherein the power divider is configured to receive the RF signal, generate radio-frequency (RF) input signals in response to the RF signal, and respectively transmit the RF input signals to the plurality of RF chip modules, wherein total power of the RF input signals is equal to power of the RF signal;
   a signal-controlling circuit electrically connected to the plurality of RF chip modules, wherein the signal-controlling circuit is configured to receive the RF input signals through the plurality of RF chip modules and adjust at least one of power and phase of each of the RF input signals to generate radio-frequency (RF) output signals; and
   a power combiner electrically connected to the signal-controlling circuit and the signal analyzer, wherein the power combiner is configured to receive the RF output signals and sum power of the RF output signals to generate a test signal, and the signal analyzer is configured to receive the test signal and obtain radio-frequency (RF) properties corresponding to at least one of power and phase of each of the RF output signals.

2. The device for testing a group of RF chip modules according to claim 1, wherein the signal-controlling circuit comprises:
   a plurality of control ICs respectively electrically connected to the plurality of RF chip modules and the power combiner, wherein the plurality of control ICs is respectively configured to receive the RF input signals through the plurality of RF chip modules; and
   a signal controller electrically connected to the plurality of control ICs, wherein the signal controller is configured to control the plurality of control ICs to adjust at least one of the power and the phase of each of the RF input signals and drive the plurality of control ICs to respectively generate the RF output signals.

3. The device for testing a group of RF chip modules according to claim 2, wherein each of the plurality of control ICs comprises:
   a phase shifter electrically connected to the signal controller and a corresponding radio-frequency (RF) chip module of the plurality of RF chip modules, wherein the phase shifter is configured to receive the RF input signal through the corresponding RF chip module, and the signal controller is configured to control the phase shifter to adjust a phase of the RF input signal;
   a variable attenuator electrically connected to the signal controller and the phase shifter, wherein the variable attenuator is configured to receive the RF input signal from the phase shifter, and the signal controller is configured to control the variable attenuator to adjust power of the RF input signal; and
   an amplifier electrically connected to the variable attenuator and the power combiner, wherein the amplifier is configured to receive the RF input signal from the variable attenuator and amplify power of the RF input signal to generate the RF output signal.

4. The device for testing a group of RF chip modules according to claim 2, further comprising a control host electrically connected to the signal controller and the signal analyzer and configured to control operation of the signal controller and the signal analyzer.

5. The device for testing a group of RF chip modules according to claim 1, further comprising a test base provided with RF sockets, wherein the RF sockets are respectively electrically connected to the plurality of RF chip modules, wherein the power combiner, the signal-controlling circuit, and the power provider are arranged on the test base and electrically connected to the test base.

6. The device for testing a group of RF chip modules according to claim 1, wherein the signal analyzer is a vector spectrum analyzer.

7. A device for testing a group of radio-frequency (RF) chip modules comprising:
   a signal analyzer configured to generate a radio-frequency (RF) signal;
   a power divider electrically connected to the signal analyzer and a plurality of radio-frequency (RF) chip modules, wherein the power divider is configured to receive the RF signal, generate radio-frequency (RF) input signals in response to the RF signal, and respectively transmit the RF input signals to the plurality of RF chip modules, wherein total power of the RF input signals is equal to power of the RF signal;
   a plurality of control ICs respectively integrated into the plurality of RF chip modules, wherein the plurality of control ICs is respectively configured to receive the RF input signals through the plurality of RF chip modules;
   a signal controller electrically connected to the plurality of control ICs, wherein the signal controller is configured to control each of the plurality of control ICs to adjust at least one of power and a phase of the corresponding RF input signal to generate a radio-frequency (RF) output signal; and
   a power combiner electrically connected to each of the plurality of control ICs and the signal analyzer, wherein the power combiner is configured to receive the RF output signal from each of the plurality of control ICs and sum power of the RF output signals of the plurality of control ICs to generate a test signal, and the signal analyzer is configured to receive the test signal and obtain radio-frequency (RF) properties corresponding to at least one of power and a phase of each of the RF output signals of the plurality of control ICs.

8. The device for testing a group of RF chip modules according to claim 7, wherein each of the plurality of control ICs comprises:
   a phase shifter electrically connected to the signal controller and a corresponding radio-frequency (RF) chip module of the plurality of RF chip modules, wherein the phase shifter is configured to receive the RF input signal through the corresponding RF chip module, and the signal controller is configured to control the phase shifter to adjust a phase of the RF input signal;
   a variable attenuator electrically connected to the signal controller and the phase shifter, wherein the variable attenuator is configured to receive the RF input signal from the phase shifter, and the signal controller is configured to control the variable attenuator to adjust a power ratio of the RF input signal; and an amplifier electrically connected to the variable attenuator and the power combiner, wherein the amplifier is configured to receive the RF input signal from the variable attenuator and amplify power of the RF input signal to generate the RF output signal with a proper signal-to-noise ratio.

9. The device for testing a group of RF chip modules according to claim 7, further comprising a control host electrically connected to the signal controller and the signal analyzer and configured to control operation of the signal controller and the signal analyzer.

10. The device for testing a group of RF chip modules according to claim 7, further comprising a test base provided with RF sockets, wherein the RF sockets are respectively electrically connected to the plurality of RF chip modules, wherein the power combiner and the power provider are arranged on the test base and electrically connected to the test base.

11. The device for testing a group of RF chip modules according to claim 7, wherein the signal analyzer is a vector spectrum analyzer.

12. A method for testing a group of radio-frequency (RF) chip modules comprising:

receiving a radio-frequency (RF) signal, generating radio-frequency (RF) input signals in response to the RF signal, and respectively transmitting the RF input signals to a plurality of RF chip modules, wherein total power of the RF input signals is equal to power of the RF signal;

receiving the RF input signals through the plurality of RF chip modules and adjusting at least one of power and a phase of each of the RF input signals to generate radio-frequency (RF) output signals;

summing power of the RF output signals to generate a test signal; and receiving the test signal and obtaining radio-frequency (RF) properties corresponding to at least one of power and phase of each of the RF output signals.

13. The method for testing a group of RF chip modules according to claim 12, wherein in the step of adjusting at least one of the power and the phase of each of the RF input signals, the phase and the power of each of the RF input signals are sequentially adjusted.

14. The method for testing a group of RF chip modules according to claim 12, wherein the adjustments of power and phase of each of the RF input signals are implemented to produce orthogonal and independent modulated signals, or mathematical-form signal basis functions for each RF path, dependent modulated signals or mathematical-form signal basis functions have N ranks of independent modulated signals, and the orthogonal and independent modulated signals, N-rank dependent signals or the mathematical-form signal basis functions are used to decompose a sum of combined signals into separate signals associated with each RF path through the operation of inner products and used to identify characteristics of the plurality of RF chip modules under test.

* * * * *